(12) United States Patent
Strittmatter

(10) Patent No.: US 8,212,287 B2
(45) Date of Patent: Jul. 3, 2012

(54) NITRIDE SEMICONDUCTOR STRUCTURE AND METHOD OF MAKING SAME

(75) Inventor: Andre Strittmatter, Menlo Park, CA (US)

(73) Assignee: Palo Alto Research Center Incorporated, Palo Alto, CA (US)

(*) Notice: Subject to any disclaimer, the term of this patent is extended or adjusted under 35 U.S.C. 154(b) by 425 days.

(21) Appl. No.: 12/562,675

(22) Filed: Sep. 18, 2009

(65) Prior Publication Data

US 2011/0068347 A1 Mar. 24, 2011

(51) Int. Cl.
*H01L 21/02* (2006.01)

(52) U.S. Cl. ............... 257/190; 257/628; 257/E33.003; 257/E21.09; 257/E21.125; 257/E21.566

(58) Field of Classification Search .................. None
See application file for complete search history.

(56) References Cited

U.S. PATENT DOCUMENTS

| 8,022,427 B2 * | 9/2011 | Miyake et al. | 257/98 |
| 2008/0099785 A1 * | 5/2008 | Bai et al. | 257/190 |
| 2008/0283846 A1 * | 11/2008 | Ohmae et al. | 257/79 |
| 2008/0283866 A1 * | 11/2008 | Takakura et al. | 257/103 |

OTHER PUBLICATIONS de Mierry, P. et al., "Improved semipolar (1122) GaN quality using asymmetric lateral epitaxy", Appl Phys Let, vol. 94, No. 191903 (2009).
Ni, X. et al., "Nonpolar m-plane GaN on patterned Si(112) substrates by metalorganic chemical vapor deposition", Appl Phys Let, vol. 95, No. 111102 (2009).
Ni, X. et al., "Epitaxial lateral overgrowth of (1122) semipolar GaN on (1100) m-plane sapphire by metalorganic chemical vapor deposition", Appl Phys Let, vol. 90, No. 182109 (2007).
Okuno, K. et al., "m-Plane GaN Films Grown on Patterned a-Plane Sapphire Substrates with 3-inch Diameter", App Phys Exp, vol. 2, 031002 (2009).
Gehrke, T. et al, "Pendeo-Epitaxy of Gallium Nitride and Aluminum Nitride Films and Heterostructures on Silicon Carbide Substrate", MRS Internet J. Semicond. Res. 4S1, G3.2 (1999).
Funato, M. et al., "Blue, Green, and Amber InGaN/GaN Light-Emitting Diodes on Semipolar {1122} GaN Bulk Substrates", Japanese Journal of Applied Physics, vol. 45, No. 26, pp. L659-L662 (2006).
Northrup, John E., "GaN and InGaN (1122) surfaces: Group-III adlayers and indium incorporation", App Phys Let 95, 133107 (2009).
Asamizu, H. et al., "Continuous-Wave Operation of InGaN/GaN Laser Diodes on Semipolar (1122) Plane Gallium Nitrides", App Phys Express 2, 021002 (2009).

(Continued)

*Primary Examiner* — Benjamin Sandvik
*Assistant Examiner* — Leslie Pilar Cruz
(74) *Attorney, Agent, or Firm* — Jonathan A. Small

(57) ABSTRACT

A structure method for producing same provides suppressed lattice defects when epitaxially forming nitride layers over non-c-plane oriented layers, such as a semi-polar oriented template layer or substrate. A patterned mask with "window" openings, or trenches formed in the substrate with appropriate vertical dimensions, such as the product of the window width times the cotangent of the angle between the surface normal and the c-axis direction, provides significant blocking of all diagonally running defects during growth. In addition, inclined posts of appropriate height and spacing provide a blocking barrier to vertically running defects is created. When used in conjunction with the aforementioned aspects of mask windows or trenches, the post structure provides sign0ificant blocking of both vertically and diagonally running defects during growth.

10 Claims, 10 Drawing Sheets

OTHER PUBLICATIONS

Fellows, N. et al., "Increased Polarization Ratio on Semipolar (1122) InGaN/GaN Light-Emitting Diodes with Increasing Indium Composition", Japanese Journal of Applied Physics, vol. 47, No. 10, pp. 7854-7856 (2008).

Zytkiewicz, Z.R. et al., "Recent Progress in Lateral Overgrowth of Semiconductor Structures from the Liquid Phase", Cryst. Res. Technol., vol. 40, No. 4/5, pp, 3321-3328 (2005).

* cited by examiner

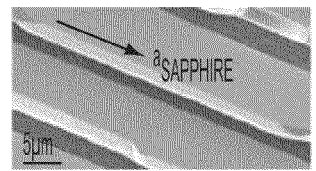
FIG. 10a
PRIOR ART
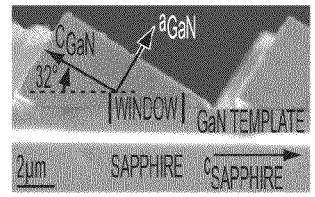
FIG. 10b
PRIOR ART
FIG. 10c
PRIOR ART
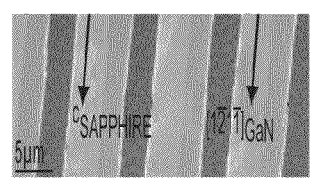
FIG. 10d
PRIOR ART
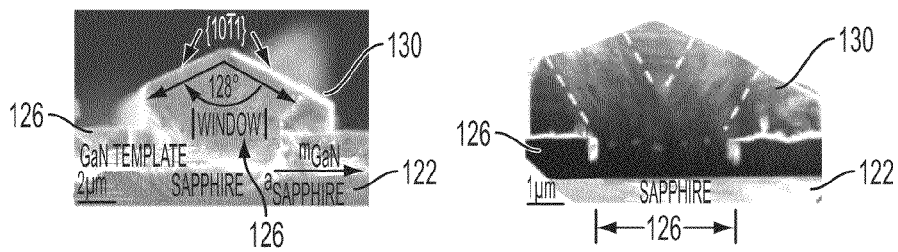
FIG. 10e
PRIOR ART
FIG. 10f
PRIOR ART

NITRIDE SEMICONDUCTOR STRUCTURE AND METHOD OF MAKING SAME

STATEMENT REGARDING FEDERALLY SPONSORED RESEARCH AND DEVELOPMENT

The U.S. Government has a fully paid-up license in this disclosure and the right in limited circumstances to require the patent owner to license others on reasonable terms as provided for by the terms of contract number W911 NF-08-C-0003 awarded by DARPA-VIGIL.

BACKGROUND

The present disclosure is related to reducing defects which form during growth of semiconductor materials over a substrate, and more specifically to reducing certain dislocations which arise due to the lattice mismatch between a substrate and a nitride material grown thereover.

It is quite well known that when epitaxially growing a material such as a semiconductor over a substrate, a mismatch in the lattice constants of the substrate and the growth material can result in crystalline defects in the material as grown. This is illustrated in FIG. 7 for a structure 100. Substrate 102 is typically oriented such that its crystal boundaries 104 are oriented roughly perpendicular to the plane of the growth surface (i.e., vertically). As a growth material 106, such as gallium nitride (GaN), forms over substrate 102, lattice defects 108 form therein which are roughly parallel to the crystal boundaries 104 of substrate 102. There are various techniques known in the art for suppressing these defects.

One material system of particular interest today is the nitride system (e.g. compounds formed between any group-III element and nitrogen). Nitride-based materials are able to produce light-emitting devices such as diode lasers and the like which emit light at shorter wavelengths corresponding to green, blue, and even ultra violet (UV) light as compared to other known material systems. Other applications for the nitrides are transistors and other electronic devices. However, nitride materials are typically grown by metalorganic chemical vapor (MOCVD) deposition techniques onto lattice-mismatched substrates like for example sapphire, silicon carbide, and silicon for which there are relatively fewer options to address and prevent lattice mismatch defects.

One known technique for suppressing lattice dislocations in MOCVD processes is known as lateral overgrowth, which is illustrated in FIG. 8. Again, a c-plane oriented substrate 102 such as $Al_2O_3$ (sapphire), is the typical starting point. In order to suppress the vertical dislocation defects, a mask layer 112 is formed over the surface of substrate 102, and one or more openings 114 are then formed in the mask. GaN layer 116 is then epitaxially grown over substrate 102, beginning in openings 114 in order to initiate the epitaxy. The GaN grows both vertically and laterally. Due to the crystallographic orientation of substrate 102, any vertical defects forming in layer 116 are limited to the opening areas, and are either suppressed or bent horizontally over the mask 112. Thus the regions over the mask 112 are substantially free of vertical lattice dislocations.

While c-plane oriented substrates have been the most widely used substrates to date, other orientations such as semi-polar and m-plane orientations are becoming increasingly important. For example, bulk semi-polar GaN substrates are highly desired for (InGaAl)N-based light emitters such as light-emitting diodes (LEDs) and laser diodes (LDs), in order to reduce internal electric fields which impair the efficiency of the light emission process on conventional c-axis oriented nitride devices. However, such bulk substrates are not yet widely available and are limited to small sizes. As an alternative to bulk semi-polar GaN substrates, semi-polar GaN templates have been grown on large area sapphire substrates by conventional means such as Hydride Vapor Phase Epitaxy (HVPE). However, the defect density in such template layers is of the order of $10^{10}$ cm$^{-2}$, unless defect reduction techniques are applied.

While lateral overgrowth is an effective technique for c-plane oriented substrates, it is not optimized for materials in which the c-axis is tilted with respect to the surface normal, such as any semi-polar oriented GaN, in which a significant portion of defects extend across the GaN layer at an angle corresponding to the tilt of the basal plane GaN(0001). With reference next to FIG. 9, one difficulty observed is that since the lattice defects 128 in semi-polar template layer 122 (or equivalently, a semi-polar substrate, not shown) run diagonally, e.g., at a given angle between 0 and 90 degrees relative to the plane of growth surface 132 of layer 122, the effectiveness of the mask at limiting communication of the defects into the growth layer 116 is reduced. FIGS. 10a-10f are TEM images of GaN(1122) layers grown by a lateral overgrowth technique on a semi-polar buffer layer, as known in the art. Cross-section images shown in FIGS. 10e and 10f highlight the persistence of diagonally running defects despite the presence of lateral overgrowth mask 126. To compound this problem, certain substrate orientations present defects in multiple different planes (e.g., perpendicular to the growth surface as well as angled relative to that plane). To date, there have been inadequate solutions for suppressing lattice defects in epitaxial growth layers formed over non-c-plane oriented layers.

SUMMARY

Accordingly, the present disclosure is directed to a method and structure for suppressing lattice defects in nitride-based epitaxial growth layers formed over non-c-plane oriented layers, such as a semi-polar oriented template layer or substrate. According to one aspect of the disclosure, a patterned mask with "window" openings formed therein with vertical dimensions according to the product of the window width times the cotangent of the angle between the surface normal and the c-axis direction for the semi-polar layer provides significant blocking of all diagonally running defects during growth.

According to another aspect of the disclosure, etched trenches in the template layer or substrate, with vertical dimensions according to the product of the trench opening width times the cotangent of the angle between the surface normal and the c-axis direction for the semi-polar layer provides significant blocking of all diagonally running defects during growth.

According to another aspect of the disclosure, etched trenches in the template layers or substrates are formed and selectively covered by a dielectric mask leaving only the facet in GaN[0001] direction uncovered.

According to a still further aspect of the disclosure, inclined posts of appropriate height and spacing provide a blocking barrier to vertically running defects is created. When used in conjunction with the aforementioned aspects of mask windows or trenches, significant blocking of both vertically and diagonally running defects during growth is provided.

The above is a summary of a number of the unique aspects, features, and advantages of the present disclosure. However, this summary is not exhaustive. Thus, these and other aspects, features, and advantages of the present disclosure will become more apparent from the following detailed description and the appended drawings, when considered in light of the claims provided herein.

BRIEF DESCRIPTION OF THE DRAWINGS

In the drawings appended hereto like reference numerals denote like elements between the various drawings. While illustrative, the drawings are not drawn to scale. In the drawings:

FIGS. 10a through 10f are TEM images of GaN layers grown by a lateral overgrowth technique on a semi-polar buffer layer, as known in the art.

DETAILED DESCRIPTION

We initially point out that descriptions of well known starting materials, processing techniques, components, equipment and other well known details are omitted so as not to unnecessarily obscure the details of the present invention. Thus, where details are otherwise well known, we leave it to the application of the present invention to suggest or dictate choices relating to those details.

As a solution to the problems of defect suppression when growing material over a non-c-plane oriented layer or substrate, the present disclosure describes a number of techniques for preparation of the growth surface according to the specific characteristics of the surface orientation. The present disclosure makes use of the fact that the tilt angle at which defects may form in the growth material is defined in part by the particular surface orientation of the layer or substrate on which the growth material is formed.

According to a first embodiment of the present disclosure, a growth material layer is formed over a template layer. A mask is formed over the template layer, and regular "windows" are formed therein. The thickness of the masking material is selected to be greater than or equal to the product of the window width times the tangent of the angle between the surface normal and the primary plane of the template material. As the growth proceeds in the window areas, all defects tilted according to the tilt of the basal plane will be blocked by the mask.

Figure 1:
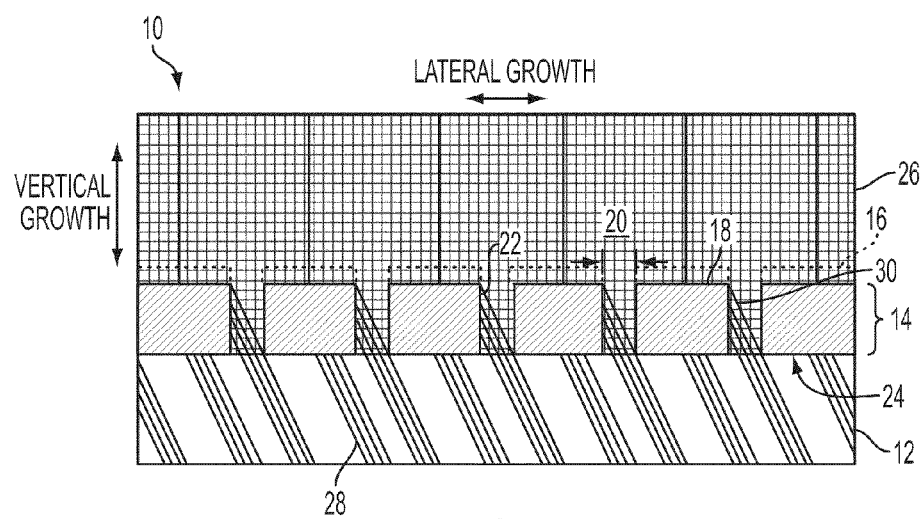
FIG. 1 is a structure with lattice defect suppressing islands formed thereon according to one embodiment of the present disclosure.

With reference to FIG. 1, a specific example of this first embodiment is next described. A structure 10 according to this embodiment comprises a template substrate 12, which may be a 1 micron thick or thicker nitride layer (e.g., GaN, AlGaN, or InGaN or combinations thereof) of semi-polar orientation (e.g., other than (0001) or (1010) oriented surface) grown by MOCVD (or any suitable method) on sapphire or any other suitable substrate (not shown). While a gallium nitride (GaN) growth material layer formed over a GaN template layer over a $Al_2O_3$ (sapphire) substrate is described in this example, other growth and substrate materials may be employed (as well as other layers of structure 10), and the particular materials of this example are selected merely for explanation purposes. In the case of wurtzitic nitride substrates, substrate 12 has a growth plane corresponding to a crystallographic plane forming an angle α other than 0 or 90 degrees to its primary crystallographic plane. For other crystallographic substrate materials, substrate 12 is oriented such that its primary crystallographic plane is at an angle α that is out of normal to said growth plane.

A dielectric layer 14, for example $SiO_2$ 2 microns thick, is deposited on template substrate 12. Next, a photoresist layer 16 is deposited, and is shown in dashed outline to represent that it is subsequently removed from the final structure. Photoresist layer 16 is patterned by conventional photolithography to form a regular pattern of stripes spaced apart by a distance, for example, in the range of 1 to 20 microns or a geometrical pattern of openings, for example 1 micrometer by 1 micrometer squares, spaced apart by a distance in a range of 1 to 20 microns (or alternatively, hexagonal or other shaped openings), although other spacings are contemplated and depend on the application of the teachings of the present disclosure.

The $SiO_2$ layer 14 is then mask-patterned using the mask of photoresist 16, for example by chemical assisted ion-beam etching (CAIBE) thereby defining islands 18 and windows 20. Islands 18 define sidewalls 22 predominantly in the direction of the c-axis (i.e., perpendicular to a growth surface 24) of the GaN unit cell and parallel to the direction of the basal plane of the GaN unit cell.

Prior to transfer into the growth chamber, selective surface cleaning is performed to remove the photoresist layer 16 while not attacking the $SiO_2$ layer 14. Following transfer to the MOCVD growth chamber, the substrate is heated to 1050° C. in an ammonia atmosphere and a layer growth (GaN, AlGaN) starts at a rate of 0.5-4 micron/hr. Layer growth proceeds both vertically and laterally, and proceeds until full coalescence is achieved (i.e., material grows uniformly both above islands 18 and windows 20), thereby forming layer 26. Thereafter, device structures (not shown) consisting of a plurality of doped or undoped GaN, InGaN, AlGaN, etc. layers may be deposited.

Figure 2:
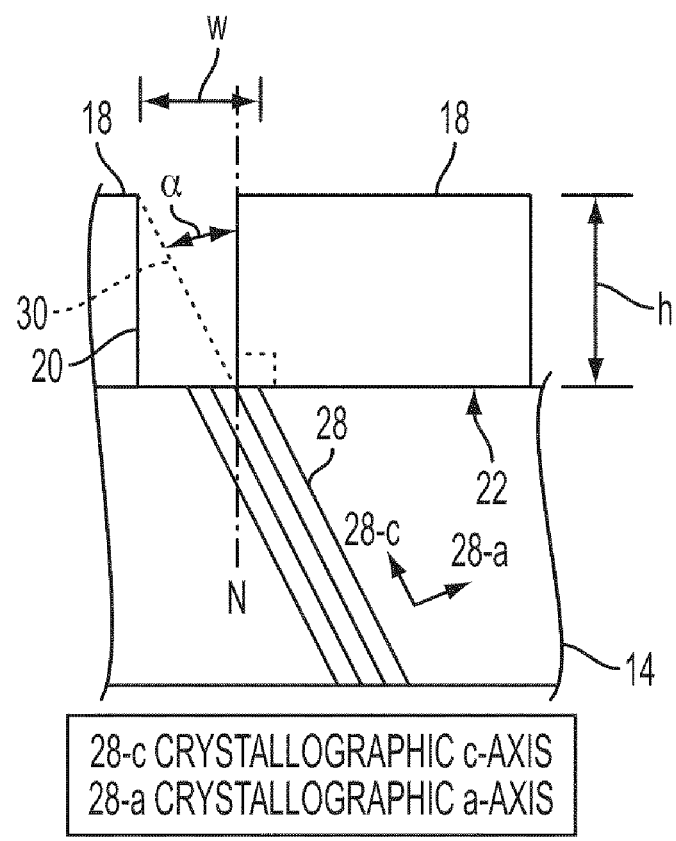
FIG. 2 is a close-up illustration of a portion of the structure of FIG. 1, showing added details of the lattice defect suppressing islands according to one embodiment of the present disclosure.

As will be appreciated from FIG. 1, the crystallographic axis of growth substrate 12 is inclined relative to growth plane 24. The thickness of layer 14, and hence the height of islands 18, is precisely chosen so that it is at least sufficiently tall that any dislocation defects 28 communicated from substrate 12 into growth layer 26 and continuing therein as defects 30 terminate at sidewall 22 (yet minimally thick for rapid surface smoothness upon coalescence of the growth island, and for ease of patterning). With reference to FIG. 2, this is calculated such that the height, h, of island 18 is greater than or equal to the product of the window width, w, times the cotangent of the angle α between the surface normal, N, and the primary plane, or $$h = w \cot \alpha$$

In a second embodiment, the growth surface is patterned by a mask and grooves are etched into the surface with a depth greater than or equal to the product of the width of the grooves times the tangent of the angle between the surface normal and the GaN[0001] direction. This takes advantage of a large difference of growth rates along the GaN[0001] and along the opposite GaN[000-1] direction. As the former is higher and leads to defect reduction, the grooves are filled with defect-reduced material and tilted defects do not propagate to the surface.

Figure 3:
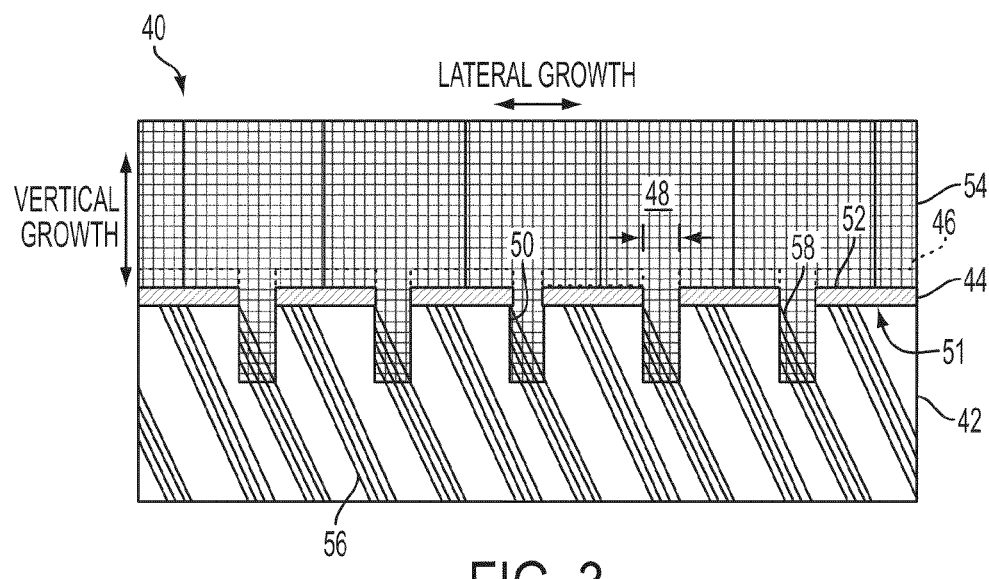
FIG. 3 is a structure with lattice defect suppressing trenches formed therein according to one embodiment of the present disclosure.

With reference to FIG. 3, there is shown therein a structure 40 according to this second embodiment of this disclosure. Structure 40 comprises a template substrate 42, which may be a 2 micron thick or thicker nitride layer (e.g., GaN, AlGaN, or InGaN or combinations thereof) of semi-polar orientation (e.g., other than (0001) or (1010) oriented surface) grown by MOCVD (or any other suitable method) on sapphire or any other suitable substrate (not shown). A dielectric layer 44, for example $SiO_2$, of 0.2 micron thickness is deposited on template substrate 42.

Next, a photoresist layer 46 is deposited, and is shown in dashed outline to represent that it is subsequently removed from the final structure. Photoresist layer 46 is patterned by conventional photolithography to form a regular geometrical pattern of openings, for example 1 micrometer by 1 micrometer square (or alternatively, hexagonal or other shaped openings, or stripes). The spacing of these regular patterns may, for example, be in a range of 1 to 20 micron, although other spacings are contemplated and depend on the application of the teachings of the present disclosure.

The $SiO_2$ layer 44 as well as substrate 42 are then mask-patterned, for example by chemical assisted ion-beam etching (CAIBE) using layer 46 as a mask, thereby defining channels 48. Channels 48 extend into substrate 42 and have a height h measured from the surface 52 of $SiO_2$ layer 44, as described further below. Channels 48 define sidewalls 50 predominantly in the direction of the c-axis (i.e., perpendicular to growth surface 51) of the GaN unit cell and parallel to the basal plane of the GaN unit cell.

Prior to transfer into the growth chamber, selective surface cleaning is performed to remove the photoresist layer 46 while not attacking the $SiO_2$ layer 44. Following transfer to the MOCVD growth chamber, the substrate is heated to 1050° C. in an ammonia atmosphere and a layer growth (GaN, AlGaN) starts at a rate of 0.5-4 micron/hr. Layer growth proceeds both vertically and laterally, and proceeds until full coalescence is achieved and layer 54 is formed. Thereafter, device structures (not shown) consisting of a plurality of doped or undoped GaN, InGaN, AlGaN, etc. layers may be deposited.

Figure 4:
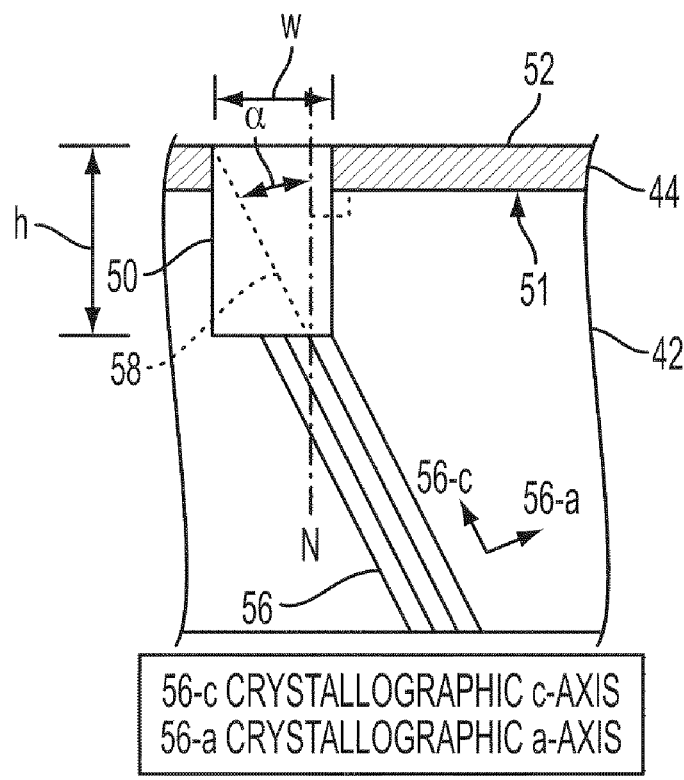
FIG. 4 is a close-up illustration of a portion of the structure of FIG. 3, showing added details of the lattice defect suppressing trenches according to one embodiment of the present disclosure.

As will be appreciated from FIG. 3, the crystallographic axis of growth substrate 42 is inclined relative to the plane of growth surface 51. The depth of channels 48 are precisely chosen so that they are at least sufficiently deep that any dislocation defects 56 communicated from substrate 42 into growth layer 54 forming new defects 58 terminate at sidewall 50. With reference to FIG. 4, this is calculated such that the height, h, of channel 48 is greater than or equal to the product of the channel width, w, times the cotangent of the angle α between the surface normal, N, and the primary plane, or $$h = w \cot \alpha$$

In a third embodiment, the growth surface is mask-patterned and grooves are etched into the surface with a depth greater than at least 0.1-0.5 μm. After etching, a masking layer is selectively deposited on all growth surfaces except for the specific facet of the grooves that points in GaN[0001] direction. This blocks any growth other than along the GaN[0001] from the highly defective seed template or substrate. Thereby, the grooves are filled with defect-reduced material and tilted defects do not propagate to the surface.

Figure 5A:
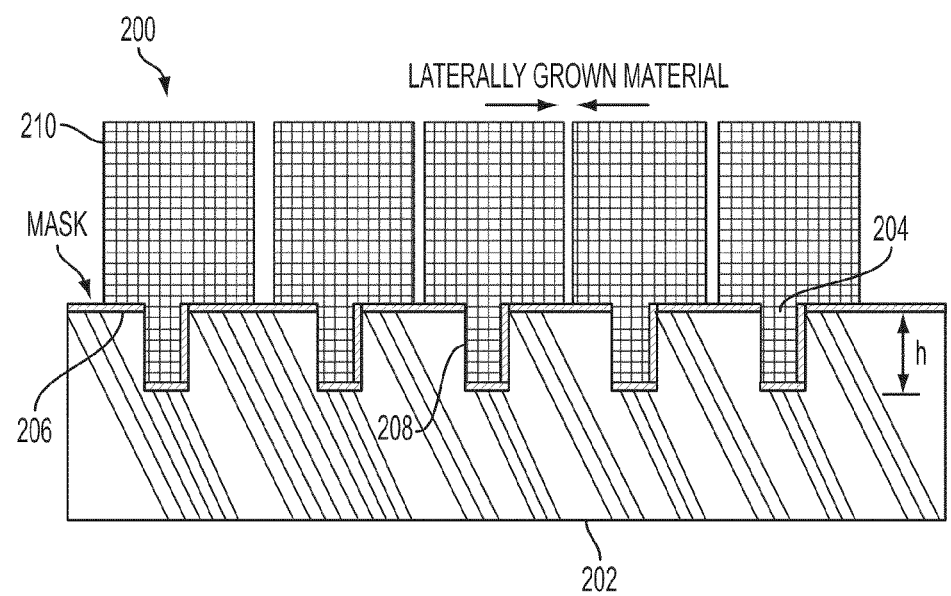
FIGS. 5A and 5B are illustrations of a structure with selectively-masked lattice defect-suppressing trenches formed therein according to one embodiment of the present disclosure.

With reference to FIG. 5A, there is shown therein a structure 200 according to this third embodiment of this disclosure. Structure 200 comprises a template substrate 202, which may be a 2 micron thick or thicker nitride layer (e.g., GaN, AlGaN, or InGaN or combinations thereof) of semi-polar orientation (e.g., other than (0001) or (1010) oriented surface) grown by MOCVD (or any other suitable method) on sapphire or any other suitable substrate (not shown). A photoresist layer (not shown) is deposited and patterned by conventional photolithography to form a regular geometrical pattern of openings, for example 1 micrometer by 1 micrometer square (or alternatively, hexagonal or other shaped openings, or stripes). The spacing of these regular patterns may, for example, be in a range of 1 to 20 micron, although other spacings are contemplated and depend on the application of the teachings of the present disclosure.

The substrate 202 is then mask-patterned, for example by chemical assisted ion-beam etching (CAIBE), thereby defining channels 204. Channels 204 extend into substrate 202 and have a height h measured from the surface 206 of substrate 202, as described further below. Channels 204 define sidewalls 208 predominantly in the direction of the c-axis (i.e., perpendicular to growth surface 206) of the GaN unit cell and parallel to the basal plane of the GaN unit cell.

Figure 5B:
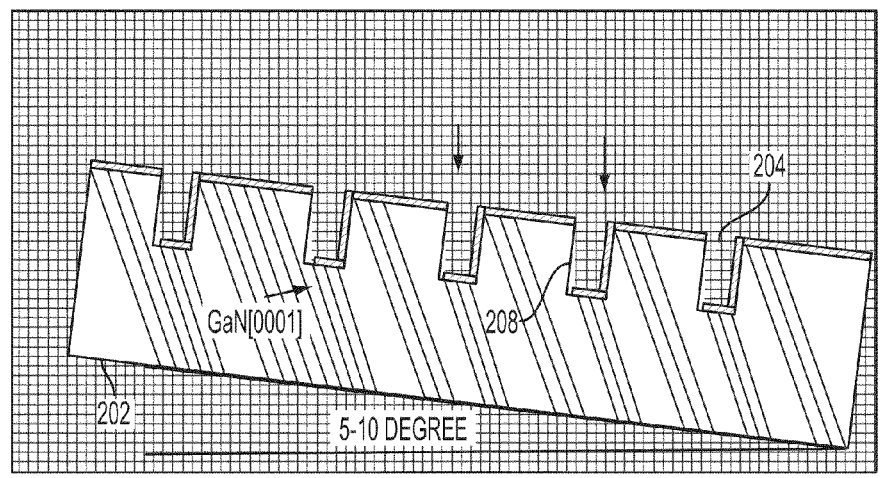

With reference to FIG. 5B, surface cleaning is performed to remove the photoresist layer. Then, the sample is loaded into an evaporation chamber in such a way that the facet pointing in the GaN[0001] direction is the only facet shaded against the evaporation source. This can be obtained by tilting the surface normal in GaN[0001] direction by about 5-10 degree. A 100 nm $SiO_2$ layer 210 is then deposited using electron beam evaporation, for example. This results in the deposition of layer 210 over surface 20, and the bottom 204a and a first side 204b of channel 204, but does not result in the deposition of layer 210 on a second side 204c of channel 204.

Returning to FIG. 5A, the substrate is transferred to an MOCVD growth chamber, and heated to 1050° C. in an ammonia atmosphere and a layer growth (GaN, AlGaN) starts at a rate of 0.5-4 micron/hr. Layer growth proceeds both vertically and laterally, and proceeds until full coalescence is achieved and layer 212 is formed. Thereafter, device structures (not shown) consisting of a plurality of doped or undoped GaN, InGaN, AlGaN, etc. layers may be deposited.

As will be appreciated from FIGS. 5A and 5B, the crystallographic axis of growth substrate 202 is inclined relative to the plane of growth surface 212. All facets are $SiO_2$-covered except for the facet pointing in the GaN[0001] direction.

Figure 6:
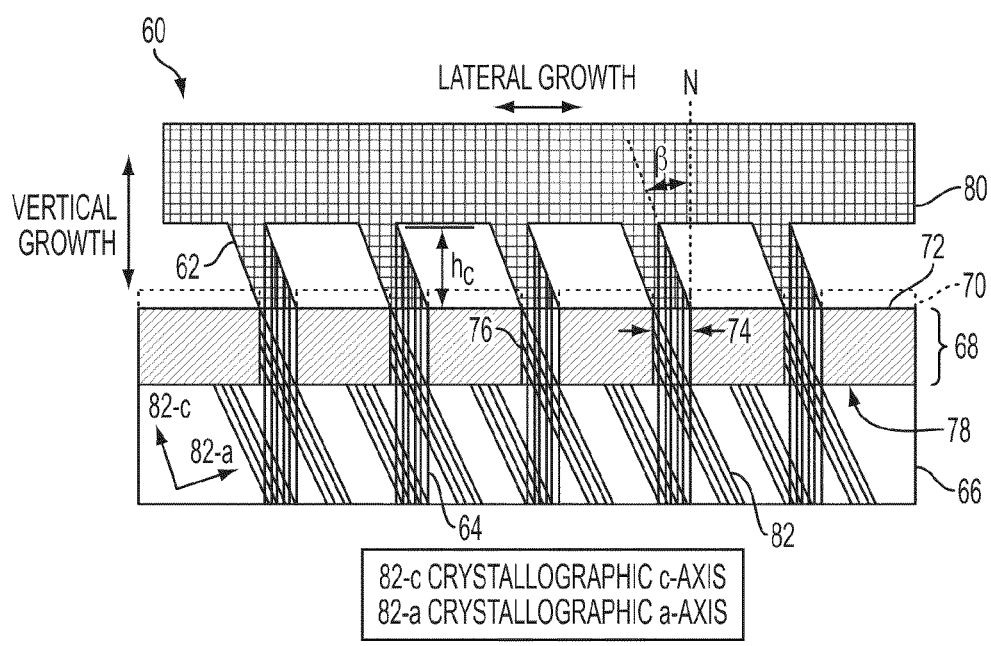
FIG. 6 is a structure with lattice defect suppressing islands and inclined posts formed thereon according to a another embodiment of the present disclosure.
Figure 7:
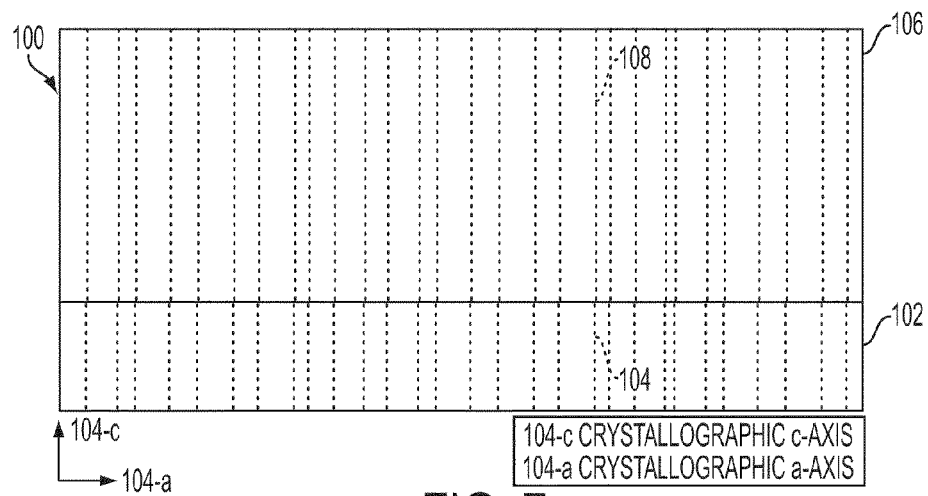
FIG. 7 is an illustration of a prior art structure showing the formation of vertical lattice defects in a growth medium formed over a crystalline substrate.
Figure 8:
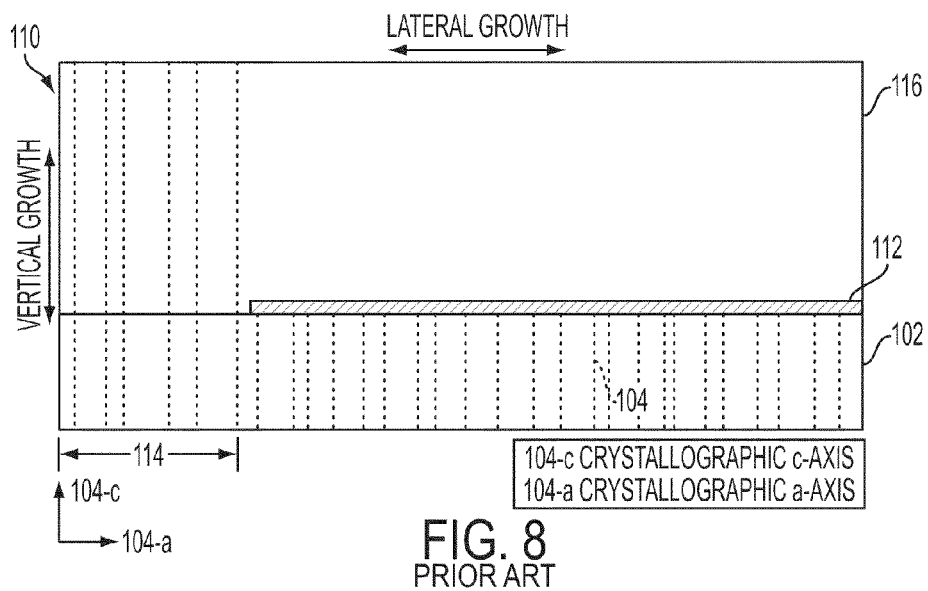
FIG. 8 is an illustration of the lateral overgrowth process according to the prior art.
Figure 9:
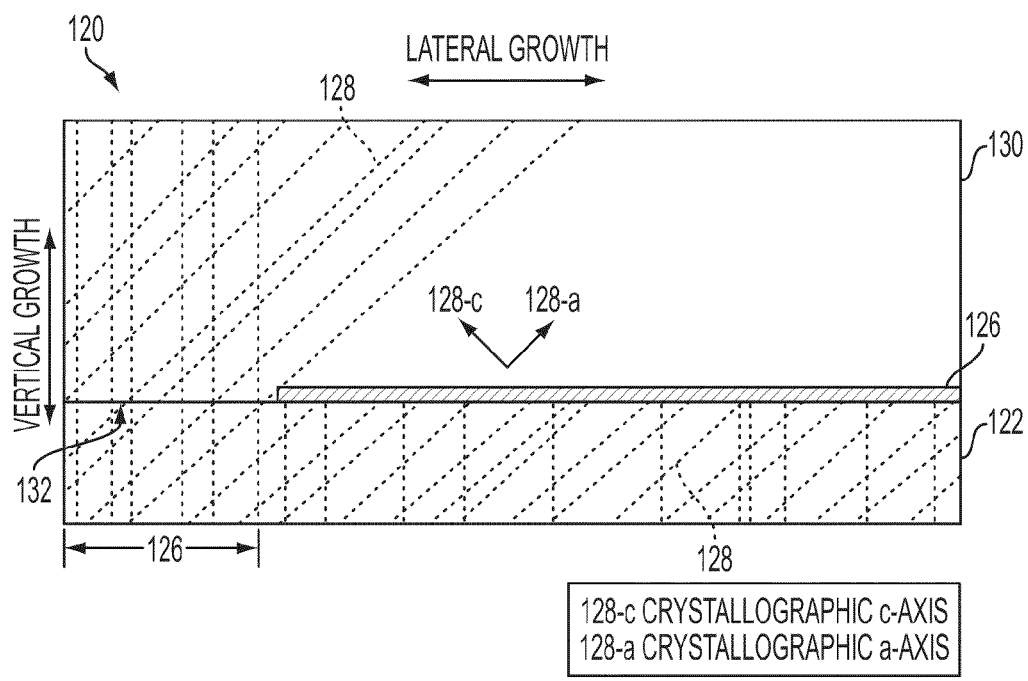
FIG. 9 is an illustration of a structure exhibiting both vertical and inclined lattice defects despite employing lateral overgrowth according to the prior art.

According to a fourth embodiment 60 shown in FIG. 6, either one or both of the techniques described above are employed together with additional processes in order to produce a structure capable of suppressing dislocation defects both in the c-plane (i.e., perpendicular to the plane of growth) as well as inclined thereto. This embodiment accommodates substrates with complex crystallographies and a variety of conditions leading to the formation of defects in materials grown thereover.

Accordingly, embodiment 60 includes a plurality of posts 62 inclined at an angle β out of the surface normal, which are formed by reducing the growth rate along the GaN[0001]-direction while increasing the growth rate in the perpendicular GaN[1010] direction (or vice versa). The relative growth rates depend on the composition of the nitride semiconductor layer and can be controlled by growth parameters such as temperature, pressure, and V/III ratio. Depending on the width of the mask opening, the GaN[0001] facet (or the GaN[1010] of post 62 will intersect with all vertically running defects 64 upon reaching a certain critical post height, $h_c$, and thereby terminate those defects. Coalescence of the posts can be forced above the critical height by changing the growth parameters in such a way that favors new growth along the GaN[0001] direction.

With reference to FIG. 6, structure 60 comprises a template substrate 66, which may be a 2 micron thick or thicker nitride layer (e.g., GaN, AlGaN, or InGaN or combinations thereof) of semi-polar orientation (e.g., other than (0001) or (1010) oriented surface) grown by MOCVD (or any other suitable method) on sapphire or any other suitable substrate (not shown). A dielectric layer 68, for example $SiO_2$ 2 microns thick, is deposited on template substrate 66.

Next, a photoresist layer 70 is deposited, and is shown in dashed outline to represent that it is subsequently removed from the final structure. Photoresist layer 70 is patterned by conventional photolithography to form a regular pattern of openings, for example 1-micrometer wide stripes. The pitch of these stripes may be in a range of 10 to 20 micron, although other spacings are contemplated and depend on the application of the teachings of the present disclosure. A larger pitch (i.e., stripe separation) is beneficial for delaying the coalescence process, as discussed further below. The mask defines sidewalls predominantly in direction of the c-axis of the GaN unit cell.

For purposes of illustration, this embodiment 60 is described employing the first "island" embodiment described above, although the second "trench" embodiment described above is equally useful herein. The $SiO_2$ layer 68 is then mask-patterned, for example by chemical assisted ion-beam etching (CAIBE) thereby defining islands 72 and windows 74. Islands 72 define sidewalls 76 predominantly in the direction of the c-axis (i.e., perpendicular to a growth surface 78) of the GaN unit cell and parallel to the basal plane of the GaN unit cell.

Prior to transfer into the growth chamber, selective surface cleaning is performed to remove the photoresist layer 70 while not attacking the $SiO_2$. The growth chamber is a vertical quartz tube with a rotating two-inch SiC-coated graphite susceptor. The susceptor body is heated by inductive heating which is controlled via pyrometric temperature reading from the backside of the susceptor. Following transfer to the MOCVD growth chamber, the substrate is heated to 1050° C. in an ammonia atmosphere and a layer growth (GaN, AlGaN) starts at a rate of 2 micron/h (for growth on a planar substrate) and a reactor pressure of 200 Torr using input flow rates of 6.7 µmol/min trimethylgallium, 4 slpm ammonia, and 6 slpm hydrogen. Growth proceeds in the GaN[0001] direction at a rate of about 1 µm/h, and greater than 5 µm/h in the GaN [1010] direction. Thereby, pre-dominant growth occurs in the GaN[1010] direction, yielding posts with side facets inclined by 58 degrees with respect to the surface. The GaN layer growth may proceed until full coalescence of layer 80 is achieved, much as described above.

Alternatively, after reaching a thickness where the sidewalls of the GaN posts are completely intercepting the surface normal over the mask openings the growth conditions may be changed to favor faster coalescence. For example, an AlGaN layer may be grown on top of the GaN post ends such that layer 80 is comprised of AlGaN. Afterwards, device structures consisting of a plurality of doped or undoped GaN, InGaN, AlGaN layers may be deposited.

The physics of modern electrical devices and the methods of their production are not absolutes, but rather statistical efforts to produce a desired device and/or result. Even with the utmost of attention being paid to repeatability of processes, the cleanliness of manufacturing facilities, the purity of starting and processing materials, and so forth, variations and imperfections result. Accordingly, no limitation in the description of the present disclosure or its claims can or should be read as absolute. The limitations of the claims are intended to define the boundaries of the present disclosure, up to and including those limitations. To further highlight this, the term "substantially" may occasionally be used herein in association with a claim limitation (although consideration for variations and imperfections is not restricted to only those limitations used with that term). While as difficult to precisely define as the limitations of the present disclosure themselves, we intend that this term be interpreted as "to a large extent", "as nearly as practicable", "within technical limitations", and the like.

Furthermore, while a plurality of preferred exemplary embodiments have been presented in the foregoing detailed description, it should be understood that a vast number of variations exist, and these preferred exemplary embodiments are merely representative examples, and are not intended to limit the scope, applicability or configuration of the disclosure in any way. Various of the above-disclosed and other features and functions, or alternative thereof, may be desirably combined into many other different systems or applications. Various presently unforeseen or unanticipated alternatives, modifications variations, or improvements therein or thereon may be subsequently made by those skilled in the art, which are also intended to be encompassed by the claims, below.

Therefore, the foregoing description provides those of ordinary skill in the art with a convenient guide for implementation of the disclosure, and contemplates that various changes in the functions and arrangements of the described embodiments may be made without departing from the spirit and scope of the disclosure defined by the claims thereto.

What is claimed is:

1. A semiconductor structure, comprising:
   a wurtzitic nitride substrate having a growth surface defining a growth plane, said growth plane corresponding to a crystallographic plane forming an angle α other than 0 or 90 degrees to the primary crystallographic plane of the substrate;
   a nitride-based growth medium disposed over said substrate; and
   structural sidewalls extending substantially normal to said growth plane and defining a plurality of window openings, said window openings having a width, w, and a height, h, said window openings further having formed therein a portion of said nitride-based growth medium such that crystallographic defects which originate at a portion of said growth surface and have an angular orientation substantially parallel to the orientation of said crystallographic plane of said substrate substantially terminate at said sidewalls and thereby substantially do not extend beyond the height of said window openings.

2. The semiconductor structure of claim 1, further comprising a dielectric layer formed over said growth surface of said substrate, said dielectric layer patterned to form islands, and wherein said structural sidewalls are sidewalls of said islands.

3. The semiconductor structure of claim 1, wherein said substrate is patterned to have trenches formed therein, and wherein said sidewalls are sidewalls of said trenches.

4. The semiconductor structure of claim 1, wherein said substrate comprises semi-polar GaN(1122).

5. The semiconductor structure of claim 1, further comprising nitride-based growth medium formed over and in physical contact with said nitride-based growth medium formed in a plurality of said window openings.

6. The semiconductor structure of claim 1, further comprising post structures said post structures:
   formed of said nitride-based growth medium;
   formed over said nitride-based growth medium formed in said window openings to a height h over said growth surface;
   formed to have sidewall facets; and
   formed to be inclined at an angle, $\beta$, relative to said growth plane and out of normal to said growth plane;
   whereby, crystallographic defects which originate at a portion of said growth surface and have an orientation substantially normal to said crystallographic plane substantially terminate at said facets and thereby substantially do not extend beyond the height h of said post structures.

7. The semiconductor structure of claim 6, further comprising nitride-based growth medium formed over and in physical contact with a plurality of said post structures.

8. The semiconductor structure of claim 1, further comprising a dielectric layer formed over and in contact with said growth surface, and further wherein said height, h, is the distance between an upper surface of said dielectric layer and said growth surface, and is at least equal to the product of the width, w, and the cotangent of the angle $\alpha$.

9. The semiconductor structure of claim 8, wherein said dielectric layer comprises silicon nitride ($SiN_x$), said nitride-based growth medium comprises gallium nitride (GaN), and said substrate comprises semi-polar GaN(1122).

10. The semiconductor structure of claim 8, wherein said dielectric layer comprises silicon nitride ($SiN_x$), said nitride-based growth medium comprises gallium nitride (GaN), and said substrate comprises semi-polar GaN(1122).

* * * * *